June 2, 1964 F. E. EAGLE 3,135,878

ADJUSTABLE WIDTH SQUARE WAVE PULSE GENERATOR CIRCUIT PRODUCING FAST RISE PULSES

Filed Sept. 14, 1962

INVENTOR.
Fred E. Eagle,
BY
H. H. Losche
Attys.

3,135,878
Patented June 2, 1964

3,135,878

ADJUSTABLE WIDTH SQUARE WAVE PULSE GENERATOR CIRCUIT PRODUCING FAST RISE PULSES

Fred E. Eagle, Orlando, Fla., assignor, by mesne assignments, to the United States of America as represented by the Secretary of the Navy Filed Sept. 14, 1962, Ser. No. 223,857
7 Claims. (Cl. 307—88.5)

Figures 1, 2:
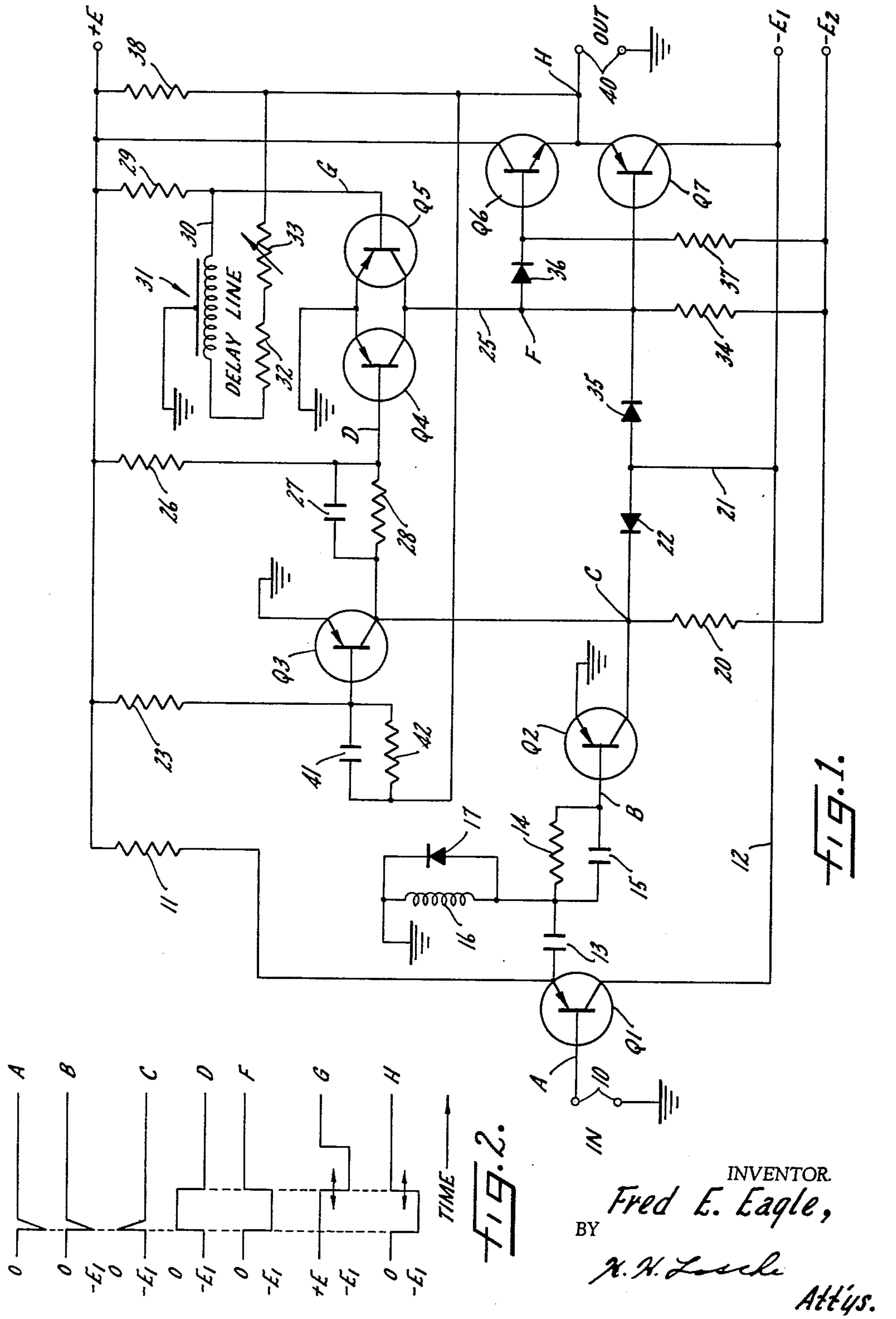

This invention relates to a pulse generator circuit and more particularly to a transistorized pulse generator logic circuit capable of producing square output waves of fast rise and fall times with the leading edge of each time coincident with the leading edge of an input pulse and with a trailing edge adjustable to vary the pulse in width independent of the width of the input pulse.

Many electronic systems are used today in which there is need for synchronizing various parts of the system. Synchronizing signals require square wave pulses that are accurately timed with respect to the leading edges of corresponding trigger or input pulses to properly time or synchronize various components of the system. There is also need for adjustably controlling the width of these synchronizing or timing pulses for the proper control of system components. There has been extensive use of blocking oscillators to perform this function but the disadvantages of blocking oscillator circuits are that it is difficult to accurately time a leading edge of the output pulse with respect to the leading edge of an input or triggering pulse and it is difficult to provide width control.

In the present invention a circuit utilizing seven transistors accepts input or triggering pulses of irregular configuration to generate corresponding output square wave pulses of which the leading edge of each output pulse is fast rising and time coincident with the leading edge of each input pulse and the trailing edge is fast falling and adjustable to provide adjustable width to the output pulse independent of the width of the triggering or input pulse. The pulse width is adjustable in this invention through the use of an adjustable delay line co-operative with a transistor switching circuit to switch the output for fast fall trailing edges. Input pulses are applied through an emitter follower transistor to trigger an emitter grounded transistor having its collector in common coupling with the collector of a third holding circuit emitter grounded transistor. The common coupling of the second and third emitter grounded transistors is coupled to one base of a pair of emitter grounded switching circuit transistors, the base of the other switching circuit transistor being coupled to the delay line. The commonly coupled, collector output of the switching transistors is coupled through a pair of driving transistors arranged in a complementary circuit manner to produce driving voltage for the generated output square waves to drive a circuit such as a terminated 93 ohm coaxial cable, or the like. Adjustment of the adjustable delay line will change the width of the generated output pulses by varying the trailing edge with respect to the leading edge thereof. It is therefore a general object of this invention to provide a transistorized pulse generator logic circuit to produce fast rise and fall time square wave pulses of adjusted width having a leading edge of each thereof time coincident with the leading edge of each corresponding triggering or input pulse in which the width of the output pulse is independent of the input pulse.

These and other objects and the attendant advantages and features of this invention will become more apparent to those skilled in the art as the description proceeds when considered along with the accompanying drawing, in which:

FIGURE 1 is a schematic circuit diagram of the pulse generator circuit of this invention, and FIGURE 2 shows a series of waveforms in time coincidence as they occur at various terminals of the circuit illustrated in FIGURE 1.

Referring more particularly to FIGURE 1 with occasional reference to FIGURE 2, an input circuit is adapted to be coupled to the input terminals 10 on which triggering or other input pulses, of waveforms such as those shown in FIGURE 2, line A, are applied to the base of an emitter follower transistor Q1. The emitter of transistor Q1 is supplied a positive voltage from E through a load resistor 11 and the collector is coupled by way of conductor means 12 to a negative collector voltage supply E1. The emitter of transistor Q1 is coupled through a capacitor 13 and a parallel network including a resistance 14 and a capacitor 15 to the base electrode of transistor Q2. The terminal of the capacitor 13 and of the parallel network 14 and 15 is coupled to ground through a parallel network consisting of an inductance 16 and a diode 17 oriented with the cathode connected to the ground terminal to effect the clamping of any positive voltage swings conducted from the emitter of transistor Q1 to the base of transistor Q2. Since the transistor Q1 is an emitter follower, any input signal, such as A of FIGURE 2, will be transmitted substantially unchanged as shown by B of FIGURE 2 to the base of transistor Q2.

The transistor Q2 and a transistor Q3 have their emitters coupled in common to ground or zero potential and their collectors coupled in common to a terminal point C. This terminal point C is coupled through a resistance 20 to a negative voltage source E2. The terminal point C is likewise coupled from the negative voltage source E1 from conductor 12 through conductor 21 and diode 22, the diode 22 being oriented with its cathode connected to the terminal point C. By this coupling arrangement terminal point C will be clamped at the —E1 voltage when transistors Q2 and Q3 are in the quiescent state. Transistor Q3 is base biased from the positive voltage source E through a biasing resistor 23 which holds the base of transistor Q3 positive with respect to its emitter, which emitter is at zero or ground potential and Q3 is thereby cut off or in the quiescent state in the absence of any input signal.

Transistors Q4 and Q5 have their emitters commonly coupled to ground potential and their collectors commonly coupled to an output conductor 25. The base of transistor Q4 is biased from the positive voltage source E through a biasing resistor 26 and coupled by a branch parallel circuit to the terminal C through the capacitor 27 and resistance 28. The base of transistor Q5 is biased from the positive voltage source E through a biasing resistor 29 and also coupled to the output conductor 30 of a delay line 31 having included therein a fixed resistor 32 and an adjustable resistor 33. The output 25 of the transistor switch circuit Q4, Q5 is thereby under the control of the base circuits applied at the terminals D and G. The common collector coupling on the output 25 of the switching transistor circuit Q4, Q5 is supplied the negative E2 voltage through a resistor 34 which is clamped at the negative E1 voltage by the clamping diode 35 having its cathode coupled to the output conductor 25 and its anode coupled to the conductor 21 from the negative E1 source. The switching diodes Q4, Q5 can thereby rapidly change the voltage on conductor 25, or at terminal F, from the negative E1 voltage level to ground potential by conduction of either transistor Q4 or Q5.

Driver output transistors Q6 and Q7 are coupled in a complementary manner by having the emitters coupled in common and the collectors directly coupled across the positive E and negative E1 voltage sources. For this complementary coupling the transistor Q6 is of an N-P-N type and the transistor Q7 is of the P-N-P type. The base of transistor Q6 is coupled to the conductor 25 through a diode 36 oriented with the cathode directly coupled to the base of the transistor and this base is biased from the negative E2 voltage source through a biasing resistor 37. The base of transistor Q7 is directly coupled to the conductor 25 at terminal F. The output of the circuit is taken from the common emitter coupling of transistor Q6 and Q7 these emitters being loaded from the positive voltage source E through a load resistor 38. The output is taken from the terminals 40 which output is shown in FIGURE 2 by waveform H taken at terminal H or the output terminals. The output at terminal H of the driving transistors Q6 and Q7 is coupled through a parallel network consisting of a capacitor 41 and a resistance 42 to the base of transistor Q3 to feed back output voltages to the base of this transistor to provide a holding circuit as will later become clear in the operation of the circuit.

As an example of circuit elements that could be used in one operative model of the circuit described in FIGURE 1, the following values will be given for the purpose of example but without in any way limiting the spirit and scope of this invention.

Transistors:
- Q1, Q2, Q3, Q4, and Q5 ---------- 2N1301
- Q6 ---------- 2N697
- Q7 ---------- 2N1494

Diodes: 17, 22, 35, and 36 ---------- IN277

Voltages:
- E=+8 volts
- —E1=—8 volts
- —E2=—28 volts

Resistors:

| | | |
|---|---|---|
| 11 | ohms | 1.5K |
| 14 | do | 10K |
| 20 | do | 2K |
| 23 | do | 22K |
| 26 | do | 22K |
| 28 | do | 4.7K |
| 29 | do | 1.5K |
| 32 | do | 75 |
| 33 | do | 500 |
| 34 | do | 1K |
| 37 | do | 2.2K |
| 38 | do | 2.2K |
| 42 | do | 10K |

Capacitors:

| | | |
|---|---|---|
| 13 | $\mu\mu$f. (micro-microfarads) | 220 |
| 15 | do | 51 |
| 27 | do | 220 |
| 41 | do | 75 |

*Operation*

In the operation of this pulse generator logic circuit, reference will be made to FIGURE 1 with occasional reference to FIGURE 2 to exemplify the waveforms at terminal points A through H as reference is made to them in the description of operation of FIGURE 1. Let it be assumed that the input terminal 10 has no signal present at which time the transistor Q1 will be conducting at some steady state establishing a direct current potential on the emitter output which will be blocked by the capacitor 13. Transistor Q2 will be quiescent since its base will be substantially at ground potential by the coupling through the resistor 14 and the inductance 16. Transistor Q3 will be quiescent since its base will be biased substantially positive through a biasing resistor 23 with respect to its grounded emitter. The voltage at terminal C, and consequently the voltage on the collectors of transistors Q2 and Q3 and on the base of transistor Q4, will be the —E1 voltage which is clamped at —E1 by the clamping diode 22. Since the negative E1 voltage is applied to the base of transistor Q4 through the resistor 28, transistor Q4 will be conducting to establish the common collector voltage of Q4 and Q5 at the potential of the common emitter voltage, which is ground or zero potential. Since the potential on the conductor 25, or terminal F, is at ground level, the output voltage at terminal 40, or at terminal H, will be at ground potential through the driving transistors Q6 and Q7. The output voltage at terminal H fed back through the resistor 42 to the base of transistor Q3 will not affect the conduction of this transistor since resistors 23 and 42 merely operate as a voltage divider and hold the base of transistor Q3 positive with respect to its grounded emitter.

Upon the occurrence of an input pulse, such as shown by A in FIGURE 2, on the base of transistor Q1, the emitter follower action of transistor Q1 will produce substantially the same voltage pulse on the base of transistor Q2 through the capacitors 13 and 15. The leading edge of this input pulse immediately places Q2 in a conductive state and thereby immediately raises the terminal voltage C from the —E1 voltage to zero potential or the ground potential of the emitter of transistor Q2. This ground potential is immediately conducted by way of the capacitor 27 to the base of transistor Q4 cutting this transistor off at which time its common collector voltage with transistor Q5 is immediaely lowered to the clamped voltage —E1 as shown in FIGURE 2, waveform F. The driver transistors Q6 and Q7 are immediately driven to produce on the output a drop in voltage from zero potential to the negative E1 potential, which —E1 potential is applied through the delay line 31 to the base of transistor Q5 as shown on terminal G and illustrated as the G voltage waveform in FIGURE 2 and, at the same time, is applied through the capacitor 41 to the base of transistor Q3 immediately placing this transistor in the conductive state. Transistor Q3 will thereafter remain in a conductive state independent of the return of the input signal A back to its zero voltage. The delay in the delay line 31 will produce a delay at terminal G as shown by the waveform G in FIGURE 2 to cause a drop in voltage to the —E1 voltage on the base of transistor Q5 thereby placing it in a conductive state which will immediately raise the potential on 25 or terminal F from the —E1 voltage to the common emitter voltage, which is ground potential. When the terminal F voltage returns to ground potential the driver transistor Q6 and Q7 will be driven through the diode 36 to produce the output trailing edge of waveform H at terminal H which will be applied through the capacitor 41 to the base of transistor Q3 thereby cutting off the conduction thereof at which time terminal C will immediately drop to its —E1 voltage again. The rapid switching of transistors Q4 and Q5 and the low resistance of resistance 34 produce at terminal F, as shown in FIGURE 2, very sharp rise and fall times of the trailing and leading edges of the output waveform H. The trailing edge of the output waveform H, which corresponds with the leading edge of the waveform G at terminal G on transistor Q5, may be adjustable in width by adjusting the variable resistor 33 to produce narrower or wider output square waves. Any attempt by positive pulses applied through the input terminal 10 to the cathode follower transistor Q1 to reach the base or Q2 will be clamped to ground potential by the clamping diode 17 thereby permitting only negative input or triggering pulses to be applied at terminal B to the base of transistor Q2.

While many modifications and changes may be made in the constructural details of the circuit shown in FIGURE 1 from the values of the elements or types of transistors used, such as by using N–P–N type transistors Q1 through Q5 instead of the P–N–P type shown to utilize reversed polarities, it is to be understood that I desire to be limited only by the scope of the appended claims and not in any way by the values given in the example.

I claim:

1. A fast rise time pulse generator circuit comprising:
an electron emission switch including a pair of transistors emitter coupled to a fixed potential and collector output coupled to an output network, the base of one transistor being coupled as one control input and the base of the other transistor being coupled as another control input;
an adjustable delay line having an input coupled to said output network and an output coupled to said one control input of said switch;
a voltage circuit for said switch to be switched to either of two voltage levels on said switch collector output; and
an input control circuit including three transistors in a voltage circuit, the first transistor of which is coupled as an emitter-follower to the base of the second transistor from a signal input, the second and third transistors of which have their collectors coupled in common and this common collector coupling is coupled to the base of said other transistor of said switch being said other control input, the leading edge of each input signal being operative in said input control circuit to switch said pair of transistors in said switch from its one to its other voltage level and to remain switched to its other voltage level until said delay line delays said leading edge of the generated change from said one voltage level to said other voltage level on the output of said output network to exercise control through said one control input to said switch to cause said switch to switch to its one voltage level whereby a pulse is generated on said output network having a fast rise time and a duration determined by the adjustment of said adjustable delay line.

2. A fast rise time pulse generator circuit as set forth in claim 1 wherein
said output network comprises a pair of transistors coupled in a complementary manner across said voltage source with the output taken from the emitters and with the input applied to the bases from said electron emission switch, and
said third transistor of said input control circuit is applied voltage from said output of said complementary transistors to its base to maintain said electron emission switch of two transistors in the switched condition to hold the switch output at said other voltage level.

3. A fast rise time pulse generator circuit comprising:
a first transistor having an input circuit coupled to the base and a voltage source across the emitter and collector;
a second transistor having the base coupled to the emitter of said first transistor, the emitter coupled to a fixed potential, and the collector coupled to a negative biasing source through a load, said base likewise being coupled to a clipping network to clip positive voltage with respect to said fixed potential;
a third transistor having its emitter connected to said fixed potential and its collector coupled to the collector of said second transistor;

fourth and fifth transistors having the emitters coupled in common to the fixed potential and said collectors coupled in common to an output network, the base of the fourth transistor being coupled to the emitter of said third transistor;
a delay line having an input coupled to said output network and an output coupled to the base of said fifth transistor; and
biasing means to normally bias said second, third, and fifth transistors to a quiescent state in the absence of an input negative signal whereby an input negative signal will produce conduction of the second, and third transistors through the base and emitter of said first transistor to generate an output pulse of a duration determined by said delay line operative to produce conduction of said fifth transistor to establish the trailing edge of said output pulse.

4. A fast rise time pulse generator circuit as set forth in claim 3 wherein
said delay line is adjustable to produce said output pulses of adjustable width.

5. A fast rise time pulse generator circuit as set forth in claim 4 wherein
said output network includes a pair of complementary transistors having their emitters coupled in common for said output, their collectors coupled across said voltage source, and their bases coupled to said common collector coupling as said fourth and fifth transistors.

6. A fast rise time pulse generator circuit as set forth in claim 4 wherein
said biasing means include resistors between said voltage source and the elements to be biased, and further includes clamping means coupled between said voltage source and the collector of said second transistor and the bases of said complementary output transistors to clamp said voltage at said biasing value.

7. A fast rise time pulse generator circuit comprising:
a first transistor having an input circuit coupled to the base and a voltage source across the emitter and collector, the emitter circuit having a load resistor therein;
a second transistor having the base coupled through a clipping network to the emitter of said first transistor and its emitter coupled to a fixed potential, said clipping network being operative to clip voltage signals positive with respect to said fixed potential;
a third transistor having its emitter coupled to said fixed potential and its collector coupled in common with the collector of said second transistor, said commonly coupled collectors being clamped at a negative biasing potential supplied through a biasing resistor from a voltage source;
fourth and fifth transistors having the emitters coupled in common to said fixed potential and the collectors coupled in common, said collectors being clamped at said negative biasing potential supplied through a biasing resistor from said negative voltage source, and the base of said fourth transistor being coupled to the common collector coupling of said second and third transistors to maintain said fourth transistor normally conducting to hold the commonly coupled collectors at said fixed potential of said commonly coupled emitters;
an output network comprising sixth and seventh transistors with the emitters coupled in a complementary manner and the collectors coupled across said voltage source, said emitters providing an output of fast rise time pulses and being coupled to the base of said third transistor, and the bases coupled to the collector output of said fourth and fifth transistors, the base of the sixth transistor being coupled through a diode and being biased through a resistor to said voltage source negative to said fixed potential; and
an adjustable delay line coupled between the output of said sixth and seventh transistors and the base of said fifth transistor to establish conduction of said fifth transistor from time delayed signals conducted through said delay line whereby a negative input signal produces conduction of said first and second transistors to switch said fourth transistor to nonconduction generating a fast rise time of the leading edge of an output pulse operative through the base of said third transistor to hold said fourth transistor in nonconduction and through said delay line to produce conduction of said fifth transistor to re-establish the common collector fixed potential of said fourth and fifth transistors to produce the trailing edge of said output pulse.

References Cited in the file of this patent

UNITED STATES PATENTS

| | | |
|---|---|---|
| 3,054,959 | Colagrossi et al. | Sept. 18, 1962 |
| 3,091,705 | Levine | May 28, 1963 |
| 3,096,445 | Herzog | July 2, 1963 |